(12) United States Patent
Von Malm

(10) Patent No.: US 8,974,679 B2
(45) Date of Patent: Mar. 10, 2015

(54) METHOD FOR MANUFACTURING AN OPTO-ELECTRONIC COMPONENT

(75) Inventor: Norwin Von Malm, Nittendorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 415 days.

(21) Appl. No.: 12/679,472

(22) PCT Filed: Aug. 12, 2008

(86) PCT No.: PCT/DE2008/001330
§ 371 (c)(1),
(2), (4) Date: Aug. 9, 2010

(87) PCT Pub. No.: WO2009/036720
PCT Pub. Date: Mar. 26, 2009

(65) Prior Publication Data
US 2011/0284494 A1 Nov. 24, 2011

(30) Foreign Application Priority Data

Sep. 20, 2007 (DE) .......................... 10 2007 044 869
Nov. 8, 2007 (DE) .......................... 10 2007 053 286

(51) Int. Cl.
| | | |
|---|---|---|
| *B29D 11/00* | (2006.01) | |
| *H01L 21/302* | (2006.01) | |
| *H01L 21/461* | (2006.01) | |
| *H01L 51/50* | (2006.01) | |

(52) U.S. Cl.
CPC .................................. *H01L 51/5036* (2013.01)
USPC ................ 216/24; 216/26; 438/689; 438/706

(58) Field of Classification Search
None
See application file for complete search history.

(56) References Cited

U.S. PATENT DOCUMENTS

| | | | |
|---|---|---|---|
| 5,294,870 A | | 3/1994 | Tang et al. |
| 5,909,081 A | * | 6/1999 | Eida et al. ...................... 313/504 |
| 6,107,452 A | * | 8/2000 | Miller et al. .................. 528/422 |
| 6,117,529 A | | 9/2000 | Leising et al. |
| 6,309,486 B1 | | 10/2001 | Kawaguchi et al. |
| 6,608,439 B1 | | 8/2003 | Sokolik et al. |
| 6,717,176 B1 | | 4/2004 | Chuang |
| 6,762,553 B1 | | 7/2004 | Yokogawa et al. |
| 6,956,323 B2 | | 10/2005 | Kawaguchi et al. |
| 7,052,355 B2 | | 5/2006 | Liu et al. |

(Continued)

FOREIGN PATENT DOCUMENTS

| | | |
|---|---|---|
| DE | 102 58 193 | 7/2004 |
| DE | 103 12 646 | 10/2004 |

(Continued)

*Primary Examiner* — Nadine Norton
*Assistant Examiner* — Stephanie Duclair
(74) *Attorney, Agent, or Firm* — Cozen O'Connor

(57) ABSTRACT

A method of producing an optoelectronic component comprises the steps of: A) providing a radiation-emitting layer sequence (1) having an active zone (13), which emits electromagnetic primary radiation when in operation, B) providing a first wavelength conversion layer (2), which converts the primary radiation at least partially into electromagnetic secondary radiation, and C) arranging the first wavelength conversion layer (2) on the radiation-emitting layer sequence (1) in the beam path of the primary radiation.

18 Claims, 4 Drawing Sheets

(56) References Cited

U.S. PATENT DOCUMENTS

| | | |
|---|---|---|
| 2004/0238837 A1 * | 12/2004 | Jacob et al. .................. 257/99 |
| 2005/0196886 A1 | 9/2005 | Jager et al. |
| 2006/0061260 A1 | 3/2006 | Leo et al. |
| 2007/0086184 A1 * | 4/2007 | Pugh et al. .................. 362/231 |
| 2007/0131954 A1 | 6/2007 | Murayama et al. |
| 2008/0001528 A1 | 1/2008 | Eida et al. |
| 2008/0203410 A1 | 8/2008 | Brunner et al. |
| 2009/0261366 A1 * | 10/2009 | Eisert et al. .................. 257/98 |

FOREIGN PATENT DOCUMENTS

| | | | |
|---|---|---|---|
| DE | 103 12 679 | 10/2004 | |
| DE | 10 2004 060 358 | 4/2006 | |
| DE | 10 2005 055 293 | 2/2007 | |
| DE | 600 26 778 | 2/2007 | |
| EP | 0 936 682 | 7/1997 | |
| WO | WO 98/39805 | 9/1998 | |
| WO | WO 2004/084309 | 9/2004 | |
| WO | WO 2007/016908 | 2/2007 | |
| WO | WO 2007036214 A1 * | 4/2007 | ............. H01L 33/00 |

\* cited by examiner

METHOD FOR MANUFACTURING AN OPTO-ELECTRONIC COMPONENT

RELATED APPLICATIONS

This is a U.S. national stage of application No. PCT/DE2008/001330, filed on Aug. 12, 2008.

This application claims priority from German patent application 10 2007 044 869.6 filed Sep. 20, 2007, and German patent application 10 2007 053 286.7 filed Nov. 8, 2007, the disclosure contents of both of which are hereby included incorporated by reference.

FIELD OF THE INVENTION

The invention relates to a method of producing an optoelectronic component.

SUMMARY OF THE INVENTION

It is an object at least of specific embodiments to provide a method of producing an optoelectronic component with a radiation-emitting layer sequence and a wavelength conversion layer.

This and other objects are attained in accordance with one aspect of the present invention directed to a method of producing an optoelectronic component according to one embodiment that comprises the steps of:
A) providing a radiation-emitting layer sequence having an active zone, which emits electromagnetic primary radiation when in operation,
B) providing a first wavelength conversion layer, which converts the primary radiation at least partially into electromagnetic secondary radiation, and
C) arranging the first wavelength conversion layer on the radiation-emitting layer sequence in the beam path of the primary radiation.

Such a method may make it possible for the radiation-emitting layer sequence and the first wavelength conversion layer to be producible separately from one another and only arranged together once production is complete. One possible advantage of such separate production of the radiation-emitting layer sequence and the first wavelength conversion layer is that process steps may be performed for example in order to provide the first wavelength conversion layer which would damage the constitution and/or functioning of the radiation-emitting layer sequence. In particular, it is possible to conceive of methods involving thermal treatment or irradiation with UV light or other electromagnetic radiation or with particles such as for instance electrons which could on the one hand be advantageous for providing the first wavelength conversion layer while on the other hand being harmful to the radiation-emitting layer sequence. The above method likewise makes possible the presence for instance of solvents, water or reactive gases as externally supplied agents or as reaction products during provision of the first wavelength conversion layer.

The statement that a layer or an element is arranged or applied "on" or "over" another layer or another element may here and hereinafter mean that the one layer or the one element is arranged in direct mechanical and/or electrical contact with the other layer or the other element. It may moreover also mean that the one layer or the one element is arranged indirectly on or over the other layer or the other element. In this case, further layers and/or elements may then be arranged between the one layer and the other.

Arrangement of the first wavelength conversion layer on the radiation-emitting layer sequence in the beam path of the primary radiation according to the above-stated method step C may here comprise attachment of the first wavelength conversion layer to the radiation-emitting layer sequence by adhesive bonding, lamination, a mechanical fastening method such as for instance clamping or a combination of the above. In particular durable and resistant connection of the radiation-emitting layer sequence and the first wavelength conversion layer may thereby be obtained. The adhesive used may take the form, for example, of a silicone- or epoxy-based material which may be cured at room temperature or at a temperature compatible with the radiation-emitting layer sequence. Advantageously, the refractive index of the adhesive is here conformed to that of the wavelength conversion layer and/or that of the radiation-emitting layer sequence.

Furthermore, method step B may comprise the following sub-steps:
B1) applying a wavelength conversion material to a carrier substrate,
B2) applying a binder to the carrier substrate and
B3) curing the binder to fix the wavelength conversion material in place.

The carrier substrate may for example comprise or be made of a transparent material. Suitable carrier substrate materials may for example be glass, plastics or metal in sheet or film/foil form, or combinations or mixtures thereof.

The wavelength conversion material and the binder, which are described in greater detail below, may thus form the first wavelength conversion layer together with the carrier substrate.

A wavelength conversion material may be applied, for example, by means of spraying, printing or dusting.

Furthermore, method step B may also comprise the following sub-steps:
B1') providing a mixture of a wavelength conversion material and a matrix material,
B2') applying the mixture to a carrier substrate,
B3') curing the mixture.

The wavelength conversion material and the matrix material, together with the carrier substrate, may form the wavelength conversion layer. Furthermore, in a further method step after step B3' the cured mixture, which comprises the wavelength conversion material and the cured matrix material, may also be detached from the carrier substrate using mechanical, optical and/or chemical methods. The cured mixture may then form the wavelength conversion layer without the carrier substrate.

Furthermore, the method step may also comprise the following sub-steps:
B1") providing a mixture of a wavelength conversion material and a matrix material,
B2") shaping a film or sheet from the mixture,
B3") curing the mixture to yield the first wavelength conversion layer.

Shaping of the mixture to yield a film or sheet may proceed by injection molding, transfer molding, compression molding, extrusion, rolling or foil drawing.

The wavelength conversion material may be suitable for absorbing the electromagnetic primary radiation at least partially and emitting it as secondary radiation with a wavelength range which differs at least in part from the primary radiation. The electromagnetic primary radiation and electromagnetic secondary radiation may comprise one or more wavelengths and/or wavelength ranges in an infrared to ultraviolet wavelength range, in particular in a visible wavelength range. In this respect, the spectrum of the primary radiation and/or the spectrum of the secondary radiation may be narrowband, i.e. the primary radiation and/or the secondary radiation may comprise a monochromatic or approximately monochromatic wavelength range. The spectrum of the primary radiation and/or the spectrum of the secondary radiation may alternatively also be broadband, i.e. the primary radiation and/or the secondary radiation may comprise a polychromatic wavelength range, wherein the polychromatic wavelength range may comprise a continuous spectrum and/or a plurality of discrete spectral components with various wavelengths. For example, the electromagnetic primary radiation may comprise a wavelength range consisting of an ultraviolet to green wavelength range, while the electromagnetic secondary radiation may comprise a wavelength range consisting of a blue to infrared wavelength range. When superimposed, the primary radiation and the secondary radiation may particularly preferably give the impression of white-colored light. To this end, the primary radiation may preferably give the impression of blue-colored light and the secondary radiation the impression of yellow-colored light, which may arise as a result of spectral components of the secondary radiation in the yellow wavelength range and/or spectral components in the green and red wavelength range.

In particular, the optoelectronic component may emit the primary radiation and the secondary radiation in superimposed manner. An external observer may therefore perceive the above-mentioned polychromatic light impression as a result of the superimposition of the electromagnetic primary radiation and electromagnetic secondary radiation. The polychromatic light impression may here depend on the relative proportions of the primary radiation and secondary radiation.

The wavelength conversion material may comprise one or more of the following materials: garnets of rare earths and alkaline earth metals, for example YAG:$Ce^{3+}$, nitrides, nitridosilicates, sions, sialons, aluminates, oxides, halophosphates, orthosilicates, sulfides, vanadates and chlorosilicates. Furthermore, the wavelength conversion material may additionally or alternatively comprise an organic material, which may be selected from a group comprising perylenes, benzopyrenes, coumarins, rhodamines and azo dyes. Further examples and embodiments are described in patent application DE 102007049005.6, the disclosure content of which is hereby included by reference. The wavelength conversion layer may comprise suitable mixtures and/or combinations of the stated wavelength conversion materials. It this way it may for example be possible for the wavelength conversion layer, as described above, to absorb in a blue first wavelength range and to emit in a second wavelength range, which comprises green and red wavelengths and/or yellow wavelength ranges.

The wavelength conversion material may be present at least partially in the form of particles, which may have a size of from 2 to 10 µm. Furthermore, in addition to the above-described conversion property, the particles may be suitable for at least partially scattering the primary radiation and/or the secondary radiation. Thus, a wavelength conversion material may be designed simultaneously as a light centre, which partially absorbs radiation from the primary radiation and emits secondary radiation, and as a scatter centre for the primary radiation and/or the secondary radiation. Such scattering properties of a wavelength conversion material may thus lead to improved coupling out of radiation. The scattering action may for example also lead to an increase in the absorption probability of primary radiation in the wavelength conversion layer, whereby a smaller layer thickness of the wavelength conversion layer may be sufficient to achieve the necessary conversion efficiency. Alternatively or in addition, scattering particles may also be admixed with the wavelength conversion material. In particular, the scattering particles may comprise for example a metal oxide, for instance titanium oxide or aluminum oxide, such as for instance corundum, and/or glass particles. The scattering particles may here have diameters or grain sizes of less than one micrometer up to an order of magnitude of 10 µm or even up to 100 µm.

The matrix material or the binder may be at least partially transparent with regard to the primary radiation and the secondary radiation and suitable for surrounding the wavelength conversion material and/or being chemically or adhesively bonded to the wavelength conversion material. The matrix material or the binder may comprise, for example, curable organic materials such as for instance siloxanes, epoxides, acrylates, methyl methacrylates, imides, carbonates, olefins, styrenes, urethanes or derivatives thereof in the form of monomers, oligomers or polymers and additionally also mixtures, copolymers or compounds therewith. For example, the matrix material or the binder may include or be an epoxy resin, polymethyl methacrylate (PMMA), polystyrene, polycarbonate, polyacrylate, polyurethane or a silicone resin such as for instance polysiloxane or mixtures thereof. Alternatively or in addition, the matrix material or the binder may also comprise inorganic materials. Advantageously, the refractive index of the matrix material or binder may here be conformed to that of the radiation-emitting layer sequence.

The matrix material or binder may be cured by the evaporation or vaporization of solvents or reaction products and/or by crosslinking reactions. Curing may here proceed by mechanical action, for instance application of pressure, by thermal action, for instance heating, by exposure to light, for instance irradiation with light in the ultraviolet to infrared wavelength range, by exposure to particles, for instance irradiation with electrons, and/or by addition of further materials, which are capable of bringing about a crosslinking reaction in the matrix material.

The wavelength conversion material(s) may here be distributed homogeneously in the matrix material or, after application of the binder, in the latter. Furthermore, the wavelength conversion layer may comprise a plurality of wavelength conversion materials which are arranged in different layers in the wavelength conversion layer.

Furthermore, the wavelength conversion material(s) may be contained in the matrix material, which may be present in a liquid phase. The liquid matrix material comprising the wavelength conversion materials may then be applied to the carrier substrate or shaped and developed in layers as a wavelength conversion layer by drying and/or crosslinking processes. Alternatively, it is also possible to vapor-deposit the matrix material comprising the wavelength conversion material in the above-described method step B2' or the binder in the above-described method step B2. Furthermore, the matrix material comprising the wavelength conversion material may be cured thereafter by crosslinking reactions.

The wavelength conversion material and/or the binder and/or the matrix material comprising the wavelength conversion material may be applied over a large area or in laterally structured manner, for example by means of screen printing. "Laterally structured" may here mean that zones on the carrier substrate remain free of the wavelength conversion material and/or of the binder and/or of the matrix material comprising the wavelength conversion material while other areas are covered thereby. This may make it possible to achieve a structured emission characteristic for the optoelectronic component, by means of which information may be imparted to an observer for example by means of at least one symbol, letter and/or pictogram.

In a further method step, a surface structure may be produced on at least one surface of the wavelength conversion layer. The surface of the wavelength conversion layer may here preferably be a surface which, after arrangement of the wavelength conversion layer on the radiation-emitting layer sequence, is a surface of the wavelength conversion layer remote from the radiation-emitting layer sequence. The surface structure may comprise roughened portions, trenches, prisms, lenses or truncated cones or combinations thereof, which may for example increase the coupling out of the primary radiation and the secondary radiation from the encapsulation arrangement. The surface structure may here be produced in the matrix material, in the binder or in the carrier substrate, depending on the configuration of the wavelength conversion layer. The surface structure may here be applied prior to method step C, namely arrangement of the wavelength conversion layer on the radiation-emitting layer sequence, by embossing, etching, roughening or laser erosion or a combination thereof.

Alternatively or in addition, a further layer may be applied to the wavelength conversion layer, in which further layer the surface structure is formed. The further layer may comprise, for example, a material, for instance a polymer material, as stated above in relation to the matrix material. The wavelength conversion layer with surface structure may be arranged on the radiation-emitting layer sequence in such a way that the surface of the wavelength conversion layer comprising the surface structure is a surface remote from the radiation-emitting layer sequence in the beam path of the primary radiation and secondary radiation.

Furthermore, the wavelength conversion layer may be produced in any desired size and the size may be changed by cutting, stamping, breaking or sawing. In particular, the size of the wavelength conversion layer may be conformed to the size, in particular the areal extent, of the radiation-emitting layer sequence. In this way, production costs may be reduced, in particular for small component sizes or component sizes which vary in the production process.

In addition, at least one second wavelength conversion layer may be provided. To provide this, the at least one second wavelength conversion layer may be produced using a method which comprises one or more features of the method steps stated above in relation to the first wavelength conversion layer.

Furthermore, a plurality of identical or different wavelength conversion layers may be provided, which may be arranged in the beam path of the primary radiation next to one another or one above the other as a stack of layers. To this end, wavelength conversion layers may be arranged next to one another or one above the other as a stack of layers prior to or after arrangement on the radiation-emitting layer sequence and adhesively bonded together or laminated. Alternatively or in addition, the first and the at least one second wavelength conversion layer may be arranged on various surfaces of the radiation-emitting layer sequence. If the wavelength conversion layers are applied for example in a laterally structured manner, graphic information such as for instance symbols, letters and/or pictograms may be represented by a stack of layers with a plurality of different wavelength conversion layers.

In one embodiment of the optoelectronic component, the radiation-emitting layer sequence is an organic radiation-emitting layer sequence, in particular an organic, radiation-emitting diode (OLED). An organic radiation-emitting layer sequence or an OLED may for example comprise a first electrode on a substrate. A functional zone with one or more functional layers consisting of organic materials may be applied over the first electrode, which may comprise the active zone for emitting the primary radiation. The functional layers may here comprise for example electron transport layers, electroluminescent layers and/or hole transport layers. A second electrode may be applied over the functional layers.

The substrate may, for example, comprise glass, quartz, plastics films, metal, metal foils, silicon wafers or another suitable substrate material. If the OLED takes the form of a "bottom emitter", i.e. the radiation generated in the functional layers is emitted through the substrate, the substrate may advantageously exhibit transparency with regard to at least some of the first radiation.

In the bottom emitter configuration the first electrode may advantageously also exhibit transparency with regard to at least some of the primary radiation. A transparent first electrode, which may take the form of an anode and thus serves as hole-injecting material, may for example comprise a transparent conductive oxide or consists of a transparent conductive oxide. Transparent conductive oxides ("TCO" for short) are transparent, conductive materials, generally metal oxides, such as for example zinc oxide, tin oxide, cadmium oxide, titanium oxide, indium oxide or indium tin oxide (ITO). In addition to binary metal-oxygen compounds, such as for example $ZnO$, $SnO_2$ or $In_2O_3$ ternary metal-oxygen compounds, such as for example $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the TCO group. Furthermore, TCOs do not necessarily correspond to a stoichiometric composition and may be also p- or n-doped.

The functional layers may comprise organic polymers, organic oligomers, organic monomers, small organic, non-polymeric molecules ("small molecules") or combinations thereof. It may in particular be advantageous for a functional layer to take the form of a hole transport layer, in order to allow effective hole injection into an electroluminescent layer or an electroluminescent zone. Materials which may prove advantageous for a hole transport layer are for example tertiary amines, carbazole derivatives, conductive polyaniline or polyethylene dioxythiophene. Furthermore, it may be advantageous for a functional layer to take the form of an electroluminescent layer. Materials suitable for this purpose are materials which comprise radiation emission based on fluorescence or phosphorescence, for example polyfluorene, polythiophene or polyphenylene, or derivatives, compounds, mixtures or copolymers thereof. Depending on the materials in the functional layers, the first radiation generated may comprise individual wavelengths or zones or combinations thereof from the ultraviolet to red range of the spectrum.

The second electrode may take the form of a cathode and thus serve as an electron-injecting material. Advantageous cathode materials may be inter alia in particular aluminum, barium, indium, silver, gold, magnesium, calcium or lithium and compounds, combinations and alloys thereof. In addition or alternatively, the second electrode may also be transparent and/or the first electrode may take the form of a cathode and the second electrode of an anode. This means in particular that the OLED may also take the form of a "top emitter".

Moreover, the OLED may comprise encapsulation, in order to provide the electrodes and the functional zone with protection from moisture and/or oxidizing substances such as for instance oxygen. The encapsulation may here surround the entire OLED including the substrate. Alternatively or in addition, the substrate may form part of the encapsulation. The encapsulation may here comprise one or more layers, wherein the layers of the encapsulation may be for example planarizing layers, barrier layers, water- and/or oxygen-absorbing layers, connecting layers or combinations thereof.

Furthermore, the radiation-emitting sequence of layers may comprise an epitaxial layer sequence, i.e. an epitaxially grown semiconductor layer sequence. In this case, the semiconductor layer sequence may for example be based on an inorganic material, for instance InGaAlN, for instance in the form of a GaN thin film semiconductor layer sequence. InGaAlN-based semiconductor layer sequences in particular include those in which the epitaxially produced semiconductor layer sequence, which generally comprises a layer sequence of different individual layers, contains at least one individual layer which comprises a material from the III-V compound semiconductor material system $In_xAl_yGa_{1-x-y}N$ with $0 \leq x \leq 1$, $0 \leq y \leq 1$ and $x+y \leq 1$.

Alternatively or in addition, the semiconductor layer sequence may also be based on InGaAlP, i.e. the semiconductor layer sequence may comprise different individual layers, of which at least one individual layer comprises a material from the III-V compound semiconductor material system $In_xAl_yGa_{1-x-y}P$ with $0 \leq x \leq 1$, $0 \leq y \leq 1$ and $x+y \leq 1$. Alternatively or in addition, the semiconductor layer sequence may also comprise other III-V compound semiconductor material systems, for example an AlGaAs-based material, or II-VI compound semiconductor material systems.

The radiation-emitting layer sequence taking the form of an epitaxial layer sequence may here be arranged on a substrate as the organic radiation-emitting layer sequence between the first and second electrodes and/or comprise encapsulation.

The first wavelength conversion layer and/or the at least one second wavelength conversion layer may here be arranged on the surface of the substrate or the encapsulation remote from the active zone.

It is possible, with a method having the above-described features, to provide for example different wavelength conversion layers with different dimensions such as thickness and area and with different mixtures and concentrations of the wavelength conversion material, which may be selected depending on requirements and combined with other wavelength conversion layers in order to produce different-colored optoelectronic components.

DETAILED DESCRIPTION OF THE DRAWINGS

Figure 1A:
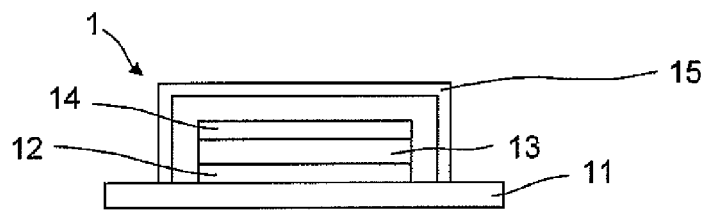
FIGS. 1A to 1E show schematic representations of a method of producing an optoelectronic component according to one exemplary embodiment.

In the exemplary embodiments and figures, identical or identically acting constituents may in each case be provided with the same reference numerals. The elements illustrated and their size ratios to one another should not in principle be regarded as being to scale, but rather individual elements, such as for example layers, components, structural elements and zones, may have been made exaggeratedly thick or large to illustrate them better and/or to make them easier to understand.

The following Figures show a radiation-emitting layer sequence 1 which comprises a substrate 11, on which a first electrode 12 and functional layers with an active zone 13 are arranged, with a second electrode 14 arranged thereover. As a result of the application of an electric current between the first and second electrodes 12, 14 the active zone emits electromagnetic, blue-colored primary radiation. Encapsulation 15 is arranged on the substrate 11 over the electrodes 12, 14 and the active zone 13, which encapsulation protects the electrodes 12, 14 and the active zone 13, together with the substrate 11, from harmful influences such as for instance oxygen and/or moisture.

The radiation-emitting layer sequence 1 may here take the form both of an organic radiation-emitting layer sequence, in particular an organic light-emitting diode (OLED), or an inorganic radiation-emitting layer sequence, in particular with an inorganic epitaxial layer sequence, as described in the general section. Solely by way of example, the following exemplary embodiments show an OLED as the radiation-emitting layer sequence 1, which takes the form of a bottom emitter.

The exemplary embodiment according to FIGS. 1A to 1E illustrates a method of producing an optoelectronic component 100. In a first method step in FIG. 1A, a radiation-emitting layer sequence 1 as described above is provided.

Figure 1B:
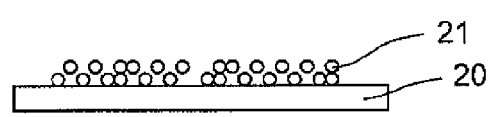
Figure 1C:
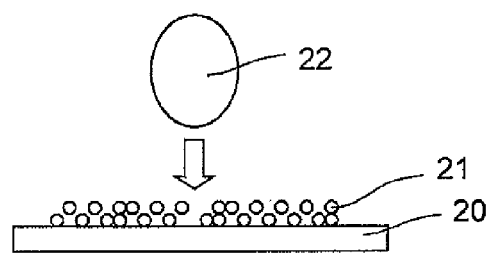
Figure 1D:
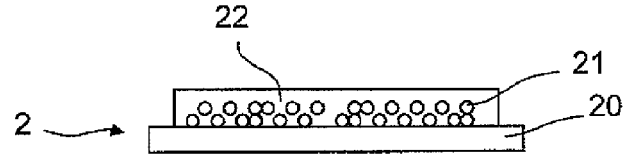

FIGS. 1B to 1D show method steps for providing a first wavelength conversion layer 2. In this case, as FIG. 1B shows, a carrier substrate 20 is provided, which in the exemplary embodiment illustrated takes the form of a plastics film. A wavelength conversion material 21 is sprayed onto the carrier substrate 20. The wavelength conversion material 21 is suitable for converting part of the primary radiation into electromagnetic, yellow-colored secondary radiation. By mixing the blue primary radiation and the yellow secondary radiation, the optoelectronic component 100 may give the impression of white-colored light when in operation.

In a further method step according to FIG. 1C, a binder material 22, in the exemplary embodiment shown a silicone or epoxy resin, is applied onto the carrier substrate 20 and the wavelength conversion material 21 and cured in a further method step according to FIG. 1D, whereby the first wavelength conversion layer 2 is provided. In the method steps according to FIGS. 1B to 1D, the processes described in the general section may be applied and materials may be used which would harm the radiation-emitting layer sequence 1. The binder 22 may be curable for example by means of UV light. Because the wavelength conversion layer 2 is produced and provided independently of the radiation-emitting layer sequence 1, simpler and cheaper production may be achieved, since the method steps do not have to be adapted to be compatible with the radiation-emitting layer sequence 1.

The first wavelength conversion layer 2 may optionally be adapted to the radiation-emitting layer sequence by cutting the area thereof to size (not shown).

Figure 1E:
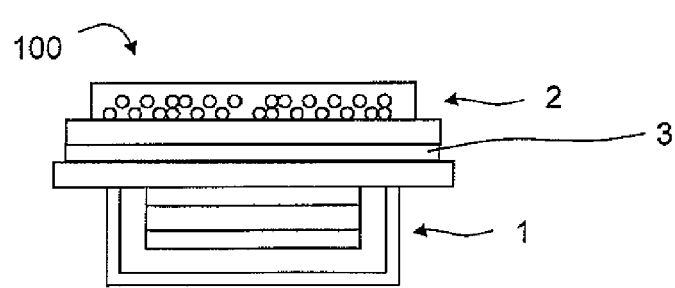

In a further method step according to FIG. 1E, the first wavelength conversion layer 2 is arranged on the radiation-emitting layer sequence 1 on the surface of the substrate remote from the active zone and adhesively bonded thereto by means of an adhesive layer 3, which consists of an epoxy resin.

The exemplary embodiment according to FIGS. 2A to 2E illustrates a further method of producing an optoelectronic component 200. In a first method step in FIG. 2A, a radiation-emitting layer sequence 1 as described above is provided.

Figure 2A:
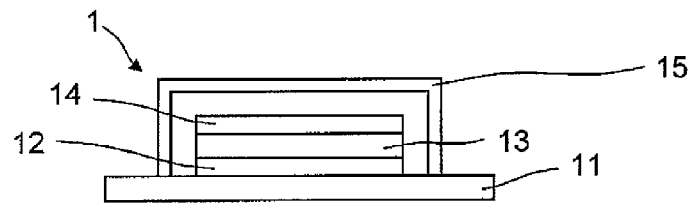
FIGS. 2A to 2E show schematic representations of a method of producing an optoelectronic component according to a further exemplary embodiment.
Figure 2B:
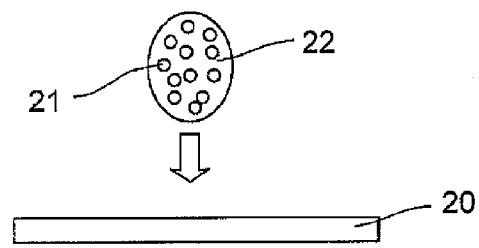
Figure 2C:
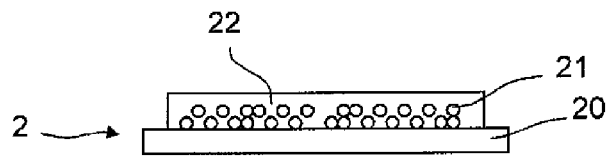
Figure 2D:
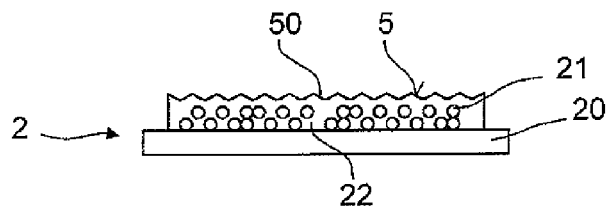

FIGS. 2B and 2C show method steps for providing a first wavelength conversion layer 2. In this case, as FIG. 2B shows, a carrier substrate 20 is provided, which in the exemplary embodiment illustrated takes the form for example of small glass sheets or plastics film. A previously provided mixture of a matrix material 22, which comprises a transparent polymer as described in the general section, and a wavelength conversion material 21 is applied onto the carrier substrate 20 and shaped into a layer. The first wavelength conversion layer 2 is produced by means of a curing step, as shown in FIG. 2C.

In a further method step (FIG. 2D), a surface structure 50 in the form of microprisms produced in a surface 5 of the wavelength conversion layer 2, namely a surface of the matrix material 22.

Figure 2E:
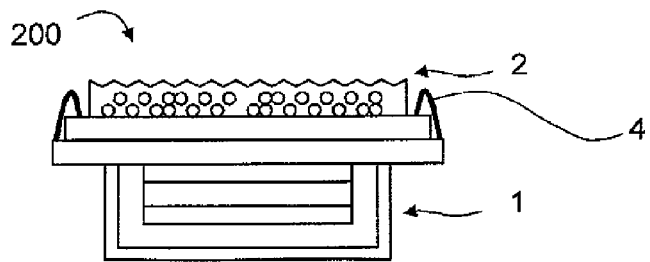

In a further method step according to FIG. 2E, the wavelength conversion layer 2 is arranged on and attached to the previously provided radiation-emitting layer sequence 1 by means of clamping devices 4.

Figure 3A:
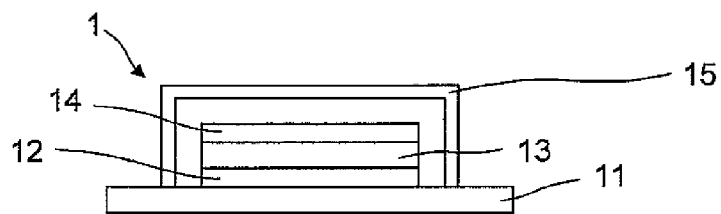
FIGS. 3A to 3C show schematic representations of a method of producing an optoelectronic component according to yet another exemplary embodiment.
Figure 3B:
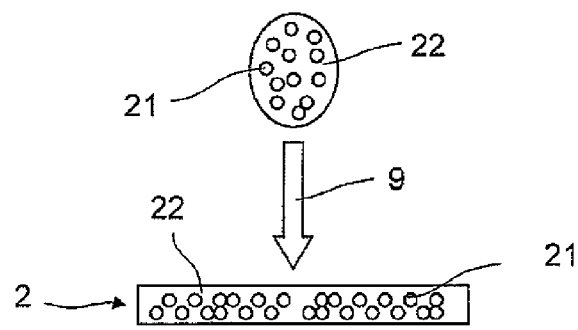
Figure 3C:
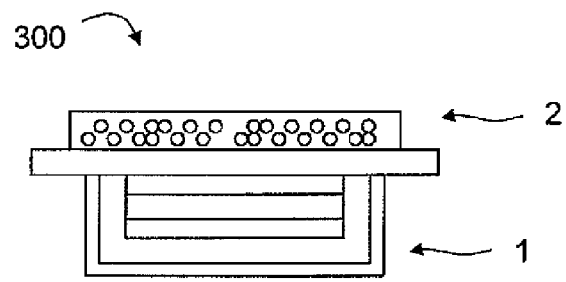

The exemplary embodiment according to FIGS. 3A to 3C illustrates a further method of producing an optoelectronic component 300. In a first method step in FIG. 3A, a radiation-emitting layer sequence 1 as described above is provided.

According to a further method step, in FIG. 3B a mixture of a liquid matrix material 22 and a wavelength conversion material 21 is provided and shaped and cured by means of a molding process 9 such as for instance injection molding to yield a planar wavelength conversion layer 2. A surface structure as in the previous exemplary embodiment may then be produced for example by the selected injection mould in at least one surface of the wavelength conversion layer 2 (not shown).

In a further method step according to FIG. 3C, the wavelength conversion layer 2 is laminated onto the radiation-emitting layer sequence 1 and joined thereto by exposure to pressure and heat. In addition, an adhesive layer may be also arranged to this end between the radiation-emitting layer sequence and the wavelength conversion layer 2 (not shown).

The exemplary embodiments according to FIGS. 4A to 4D show further optoelectronic components 400, 401, 402 and 403, which may be produced by means of one of the methods previously shown.

The optoelectronic component 400 here comprises a layer stack consisting of a first wavelength conversion layer 2 and a second wavelength conversion layer 2', which are firstly produced and provided, then arranged into a layer stack and laminated and thereafter arranged on the radiation-emitting layer stack 1.

In addition to the first wavelength conversion layer 2 on one surface of the radiation-emitting layer sequence 1, the optoelectronic component 401 comprises a second wavelength conversion layer 2' on a further surface of the radiation-emitting layer sequence 1. Such an embodiment is suitable in particular for a bilaterally emitting radiation-emitting layer sequence 1, i.e. for instance for an OLED which simultaneously takes the form of a top emitter and a bottom emitter. Depending on the wavelength conversion material selected in the first and second wavelength conversion layers 2, 2' it is possible to give an observer the same or different light impression on the two sides.

Figure 4A:
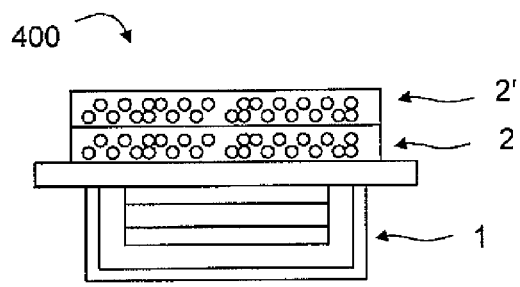
FIGS. 4A to 4D are schematic representations of optoelectronic components according to further exemplary embodiments.
Figure 4B:
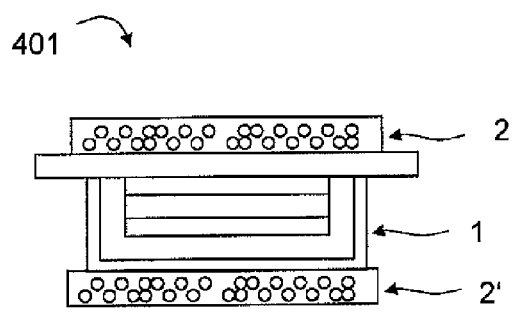
Figure 4C:
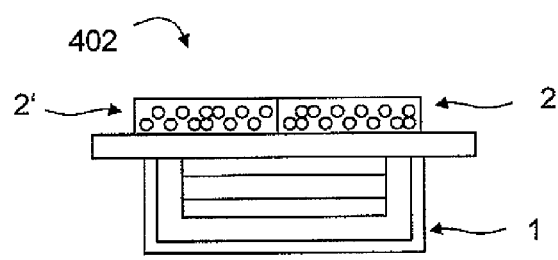

The optoelectronic component 402 according to FIG. 4C comprises a first wavelength conversion layer 2 and a second wavelength conversion layer 2', which are arranged next to one another on the radiation-emitting layer sequence 1. Thus, for example, the observer may be given a different light impression in different zones of the optoelectronic component 402 through the selection of different wavelength conversion materials for the first or second wavelength conversion layer 2, 2'.

Figure 4D:
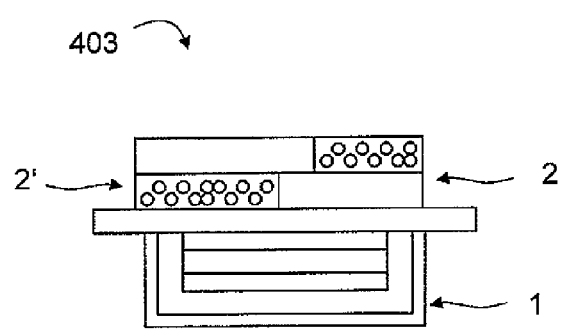

As with the optoelectronic component 400 according to FIG. 4A, the optoelectronic component 403 according to FIG. 4D comprises a layer stack consisting of the wavelength conversion layer 2 and the wavelength conversion layer 2', the wavelength conversion material of each of the wavelength conversion layers 2 and 2' only covering one zone of the substrate. This enables polychromatic, structured emission for imparting graphic and/or symbolic information.

In the exemplary embodiments shown, the first and second wavelength conversion layers 2, 2' may be produced by means of identical or different ones of the above-described method steps and identical or different matrix materials, binder materials and/or wavelength conversion materials. In addition to the respective first wavelength conversion layers 2 and 2' of the exemplary embodiments shown, further wavelength conversion layers and layer stacks with wavelength conversion layers may be arranged in the beam path of the primary radiation of the radiation-emitting layer sequence 1.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method of producing an optoelectronic component, comprising the steps of:
   A) providing an encapsulated radiation-emitting layer sequence having an active zone, which emits electromagnetic primary radiation during operation;
   B) providing a first wavelength conversion layer, which converts the primary radiation at least partially into electromagnetic secondary radiation, the first wavelength conversion layer and the encapsulated radiation-emitting layer sequence being produced separately from one another; and
   C) arranging the first wavelength conversion layer on the encapsulated radiation-emitting layer sequence in a beam path of the primary radiation by clamping after production of the first wavelength conversion layer and after production of the encapsulated radiation-emitting sequence.

2. The method according to claim 1, wherein step B comprises the following sub-steps:
   B1) applying a wavelength conversion material to a carrier substrate,
   B2) applying a binder to the carrier substrate, and
   B3) curing the binder to fix the wavelength conversion material in place.

3. The method according to claim 2, wherein in step B1 the wavelength conversion material is applied by one of spraying, printing and dusting.

4. The method according to claim 2, wherein curing proceeds thermally by one of irradiation with light, irradiation with electrons and chemical reaction.

5. The method according to claim 2, wherein in step B only zones of the carrier substrate are coated with the wavelength conversion material.

6. The method according to claim 1, wherein step B comprises the following sub-steps:
   B1') providing a mixture of a wavelength conversion material and a matrix material,
   B2') applying the mixture to a carrier substrate, and
   B3') curing the mixture.

7. The method according to claim 1, wherein step B comprises the following sub-steps:
- B1") providing a mixture of a wavelength conversion material and a matrix material,
- B2") shaping a film or sheet from the mixture, and
- B3") curing the mixture to yield the first wavelength conversion layer.

8. The method according to claim 7, wherein the shaping in step B2" proceeds by at least one of injection molding, transfer molding, compression molding, extrusion, rolling and foil drawing.

9. The method according to claim 1, wherein, prior to method step C, step B comprises the following sub-step:
- B4) producing a surface structure in at least one surface of the wavelength conversion layer,
  - wherein roughened portions, trenches, prisms, lenses or truncated cones may be produced as surface structures.

10. The method according to claim 9, wherein in step B4 the surface structures are produced by at least one of embossing, etching, roughening and laser erosion.

11. The method according to claim 1, wherein step B comprises the following further sub-step:
- B5) changing a size of the first wavelength conversion layer by one of cutting, stamping, breaking and sawing.

12. The method according to claim 1, wherein steps B and C are additionally performed for at least one second wavelength conversion layer.

13. The method according to claim 12, wherein the first wavelength conversion layer and the at least one second wavelength conversion layer are arranged on mutually different surfaces of the encapsulated radiation-emitting layer sequence in the beam path of the primary radiation.

14. The method according to claim 12, wherein the first wavelength conversion layer and the at least one second wavelength conversion layer are arranged over one another on the encapsulated radiation-emitting layer sequence in the beam path of the primary radiation.

15. The method according to claim 1, wherein the step A of providing the encapsulated radiation-emitting layer sequence comprises the following further sub-steps:
- A1) arranging a first electrode, functional layers with an active zone, and a second electrode on a substrate, and
- A2) arranging an encapsulation on the substrate covering the first electrode, the functional layers and the second electrode.

16. The method according to claim 15, wherein the separately produced first wavelength conversion layer is arranged on one of the substrate and the encapsulation on a surface remote from the first electrode, the functional layers and the second electrode.

17. A method of producing an optoelectronic component, comprising the steps of:
- A) providing an organic radiation-emitting layer sequence with a first electrode, functional layers with an active zone and a second electrode arranged on a substrate and covered by an encapsulation on the substrate, the active zone emitting electromagnetic primary radiation during operation;
- B) providing a first wavelength conversion layer, which converts the primary radiation at least partially into electromagnetic secondary radiation, the first wavelength conversion layer and the organic radiation-emitting layer sequence being produced separately from one another; and
- C) arranging the first wavelength conversion layer on the organic radiation-emitting layer sequence in a beam path of the primary radiation on one of the substrate and the encapsulation on a surface remote from the first electrode, the functional layers and the second electrode by clamping after production of the first wavelength conversion layer and after production of the radiation-emitting layer sequence.

18. A method of producing an optoelectronic component, comprising the steps of:
- A) providing an encapsulated radiation-emitting layer sequence having an active zone, which emits electromagnetic primary radiation during operation, wherein providing the encapsulated radiation-emitting layer sequence comprises the following sub-steps:
  - A1) arranging a first electrode, functional layers with an active zone, and a second electrode on a substrate, and
  - A2) arranging an encapsulation on the substrate covering the first electrode, the functional layers and the second electrode;
- B) providing a first wavelength conversion layer, which converts the primary radiation at least partially into electromagnetic secondary radiation, the first wavelength conversion layer and the encapsulated radiation-emitting layer sequence being produced separately from one another, wherein providing the first wavelength conversion layer comprises sub-steps B1 to B3 or B1' to B3', with:
  - B1) applying a wavelength conversion material to a carrier substrate, the carrier substrate being different from the encapsulation and being provided separately from the encapsulated radiation-emitting layer sequence,
  - B2) applying a binder to the carrier substrate, and
  - B3) curing the binder to fix the wavelength conversion material in place; and
  - B1') providing a mixture of a wavelength conversion material and a matrix material,
  - B2') applying the mixture to a carrier substrate, the carrier substrate being different from the encapsulation and being provided separately from the encapsulated radiation-emitting layer sequence, and
  - B3') curing the mixture; and
- C) arranging the first wavelength conversion layer by one of adhesive (i) bonding, (ii) lamination and (iii) clamping on the encapsulated radiation-emitting layer sequence in a beam path of the primary radiation after production of the first wavelength conversion layer and after production of the encapsulated radiation-emitting sequence.

* * * * *